United States Patent
Bernhardt et al.

(10) Patent No.: US 6,417,754 B1
(45) Date of Patent: *Jul. 9, 2002

(54) THREE-DIMENSIONAL COIL INDUCTOR

(75) Inventors: Anthony F. Bernhardt, Berkeley; Vincent Malba, Livermore, both of CA (US)

(73) Assignee: The Regents of the University of California, Oakland, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 40 days.

(21) Appl. No.: 09/206,498

(22) Filed: Dec. 7, 1998

Related U.S. Application Data

(60) Provisional application No. 60/067,955, filed on Dec. 8, 1997.

(51) Int. Cl.[7] ............................................. H01F 5/00
(52) U.S. Cl. ...................... 336/200; 336/223; 336/232; 29/602.1
(58) Field of Search ................................ 336/200, 232, 336/223; 29/602.1, 605

(56) References Cited

U.S. PATENT DOCUMENTS

| | | | | |
|---|---|---|---|---|
| 5,194,806 A | * | 3/1993 | Obama | 324/209 |
| 5,241,450 A | * | 8/1993 | Bernhardt et al. | 361/689 |
| 5,372,967 A | * | 12/1994 | Sundaram et al. | 438/381 |
| 5,450,755 A | * | 9/1995 | Saito et al. | 73/763 |
| 5,534,830 A | * | 7/1996 | Ralph | 333/128 |
| 5,576,680 A | * | 11/1996 | Ling | 336/200 |
| 5,766,441 A | * | 6/1998 | Arndt et al. | 205/170 |
| 5,781,091 A | * | 7/1998 | Krone et al. | 336/200 |
| 5,793,272 A | * | 8/1998 | Burghartz et al. | 336/200 |
| 5,834,162 A | * | 11/1998 | Malba | 430/317 |
| 5,933,712 A | * | 8/1999 | Bernhardt et al. | 438/125 |

OTHER PUBLICATIONS

Ahn et al., A Fully Integrated Planar Toroidal Inductor with a Micomachined Nickel–Iron Magnetic Bar, Sep. 1994, pp. 463–469.*

Senda et al., High Frequency Magnetic Properties of CoFe/SiO2 Multilayer Film with the Inverse Magnetostrictive Effect, Jan. 1994, pp. 155–158.*

Microwave Inductors and Capacitors in Standard Multilevel Interconnect Silicon Technology, Joachim N. Burghartz, IEEE Transactions on Microwave Theory and Techniques, vol. 44, No. 1, Jan. 1996, pp. 100–104.

Si IC–Compatible Inductors and LC Passive Filters, Nhat M. Nguyen et al., IEEE Journal of Solid–State Circuits, vol. 25, No. 4, Aug. 1990, pp. 1028–1031.

Surface Micromachined Solenoid Inductors for High Frequency Applications, Yong–Jun Kim et al., IEEE Transactions on Components, Packaging, and Manufacturing Technology, Part C, vol. 21, No. 1, Jan. 1998, pp. 26–33.

* cited by examiner

Primary Examiner—Anh Mai
(74) Attorney, Agent, or Firm—Christopher J. Horgan; James S. Tak; Alan H. Thompson

(57) ABSTRACT

A three-dimensional coil inductor is disclosed. The inductor includes a substrate; a set of lower electrically conductive traces positioned on the substrate; a core placed over the lower traces; a set of side electrically conductive traces laid on the core and the lower traces; and a set of upper electrically conductive traces attached to the side traces so as to form the inductor. Fabrication of the inductor includes the steps of forming a set of lower traces on a substrate; positioning a core over the lower traces; forming a set of side traces on the core; connecting the side traces to the lower traces; forming a set of upper traces on the core; and connecting the upper traces to the side traces so as to form a coil structure.

22 Claims, 8 Drawing Sheets

THREE-DIMENSIONAL COIL INDUCTOR

REFERENCE TO PROVISIONAL APPLICATIONS TO CLAIM PRIORITY

A priority date for this present U.S. patent application has been established by prior U.S. Provisional patent application, Serial No. 60/067,955, entitled "Monolithic High-Performance Three-Dimensional Coil Inductors for Wireless Communication Applications," filed on Dec. 8, 1997 by inventor Anthony F. Bernhardt.

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates generally to inductive devices and methods for fabricating such devices, and more particularly to a three-dimensional coil inductor.

2. Discussion of Background Art

Inductors are a fundamental electromagnetic component necessary to a wide variety of devices, such as actuators, relays, motors, DC-to-DC converters and RF circuits. Inductors having large inductances typically consist of wires wrapped around a bulk dielectric or ferromagnetic core, such as those used in power converters and relays. Power delivery and conversion subsystems incorporating such inductors are often one of the largest, heaviest, and most physically awkward components of an electronic system. Relays also require large inductances for proper operation and, as a result, are typically very bulky and complex devices. In addition, relays currently are built with a large number of discrete parts, which are often laboriously fabricated.

Small inductors are substantially two-dimensional (i.e. their lateral dimensions greatly exceed their vertical dimension) thin-film devices etched on either circuit boards or silicon wafers. Spiral inductors fabricated on a silicon substrate are one such example. Such inductors typically have very small inductances and a limited usefulness due to a magnetic coupling with the silicon substrate resulting in eddy-current loss and a higher than normal parasitic capacitance. As a result, the inductance, energy storage and power handling of such inductors are very limited. Likewise, miniature electrostatic relays have been produced, using thin film techniques, however, they often fail to develop sufficient magnetic force to ensure a reliable metal-to-metal contact.

Currently, there exists a need in the art for physically small inductors having relatively large inductances. For instance, RF communication devices are becoming increasingly popular, and competition is driving the development of smaller and more efficient RF devices. A typical RF communication device, such as a cellular telephone operates at around 1 GHz and requires inductors with an inductance on the order of 5nH, a Q of at least 10, and a self-resonant frequency well in excess of the operating frequency.

Many of these inductors are required to fabricate oscillators, filters and matching networks that go into such devices; however, current manufacturing techniques fail to reach such performance levels. For example, conventional aluminum spiral inductors fabricated on standard silicon substrates achieve Q-factors of around only 3 at 1 GHz.

In addition, smaller power converters and relays for a variety of applications are also needed which can not be manufactured using current techniques.

In response to the concerns discussed above, what is needed is an inductor that overcomes the problems of the prior art.

SUMMARY OF THE INVENTION

The present invention is a three-dimensional coil inductor and a method for fabricating said inductor. The inductor can take two forms. A first inductor includes a substrate, such as a silicon wafer; a set of lower electrically conductive traces positioned on the substrate; a core placed over the lower traces; a set of side electrically conductive traces laid on the core and the lower traces; and a set of upper electrically conductive traces attached to the side traces so as to form the first inductor. A second inductor includes a substrate including a recess; a set of lower traces placed on the substrate within the recess; a set of side traces placed on the substrate and attached to the set of lower traces within the recess; a core positioned over the lower traces; and a set of upper traces overlaying the core and attached to the set of side traces so as to form the second inductor.

Fabrication of the first inductor includes the steps of forming a set of lower traces on a substrate; positioning a core over the lower traces; forming a set of side traces on the core; connecting the side traces to the lower traces; forming a set of upper traces on the core; and connecting the upper traces to the side traces so as to form a coil structure. Fabrication of the second inductor includes the steps of providing a substrate having a recess; forming a set of lower traces within the recess; forming a set of side traces within the recess; connecting the side traces to the lower traces; positioning a core over the lower traces; forming a set of upper traces on the core; and connecting the upper traces to the side traces so as to form a coil structure.

The present invention permits fabrication of miniature three-dimensional versions of efficient, macroscopic coil or solenoidal inductors as well as other electromagnetic components and systems. The present invention is particularly useful in RF applications, such as cellular phones, where improvements in IC technology can yield a significant competitive advantage. The three-dimensional inductor structure minimizes capacitive coupling to the substrate and eddy current loss. Low fabrication temperatures enable the inductor to be placed on top of a substrate having active devices without affecting characteristics of those devices. Thick copper traces can be used to reduce series resistance, ensuring a high Q factor for RF applications, possibly enabling construction of monolithic wireless transceivers. Monolithic indicates that inductor windings are deposited on a three dimensional inductor core, in contrast to current practices of either wrapping a wire around a three dimensional core, or depositing metal on a substantially two dimensional core.

Electromagnets which can handle higher coil currents and operate relays can also be fabricated using the techniques of the present invention. Compact and integrated power converters can also be fabricated. Such power converters could find application in various power generation, storage and distribution systems. Performance of such devices would far exceed that of conventional component-based systems in terms of power density, efficiency, form factor and cost.

These and other aspects of the invention will be recognized by those skilled in the art upon review of the detailed description, drawings, and claims set forth below.

DETAILED DESCRIPTION OF THE PREFERRED EMBODIMENT

Figure 1A:
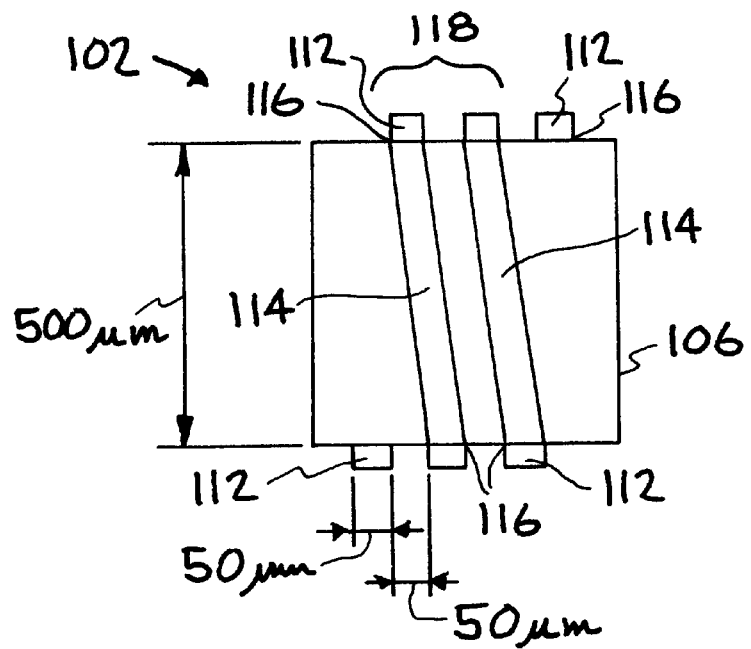
FIGS. 1A and 1B are pictorial diagrams of a top view and a cross-section view of a first three-dimensional coil inductor fabricated on a first substrate.
Figure 1B:
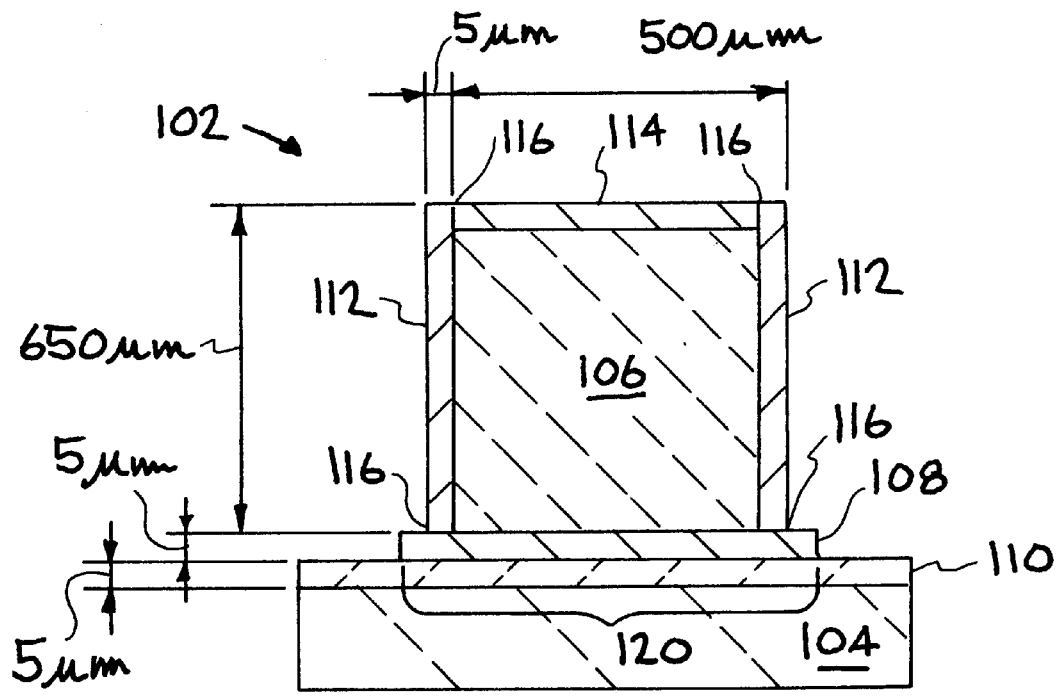

FIGS. 1A and 1B are pictorial diagrams of a top view and a cross-section view of a first three-dimensional coil inductor 102 fabricated on a first substrate 104. The first substrate 104 is a silicon-substrate, however, those skilled in the art will recognize that the first inductor 102 may also be constructed over a non-silicon substrate. The inductor 102 consists of a set of traces formed about a central core 106. The traces include a set of lower traces 108 formed over an oxide 110 on the substrate 104, a set of side traces 112 formed about the core 106, and a set of upper traces 114 formed on top of the core 106. The traces 108, 112, 114 are connected to each other at a series of joints 116 to form a continuous spiral loop which is the inductor 102. In an alternate embodiment, the core 106 can be dissolved or otherwise removed from the inductor 102.

The first inductor 102 shown in FIG. 1 is a two-turn 118 coil inductor. The inductor 102 design reduces a portion 120 of the inductor 102 which is in a close proximity to the substrate 104. Such design reduces substrate 104 loss and thus increases a Q-factor and a self-resonant frequency of the inductor 102, when compared with common spiral conductors.

Dimensions shown in FIG. 1 depict an experimental inductor. Additional details on the experimental inductor follow, however, those skilled in the art will recognize that other embodiments of the inductor 102 may have a different number of turns, set of dimensions, and may be formed from a different set of materials. In the experimental inductor, the traces are formed of Copper (Cu). The low sheet resistance of the copper supports a higher Q-factor. The trace thickness is set to 5 um for inductor operating frequencies near 1 GHz. Trace width is set to about 50 um. The core 106 can be Alumina, which has minimal loss and therefore also supports a high Q-factor at high frequencies, or the core 106 can be a ferro-magnetic material, depending upon how the inductor is to be used. Using a first construction method, the core 106 is prefabricated and placed on top of the lower traces 108. In such first construction method a core width should be sufficiently wide so as to discourage tilting of the core 106 during attachment. However, using a second preferred construction method, a mold, having an opening over where the core 106 is to be positioned, is placed over the substrate 104 and a core material is directed into the opening. The second construction method is preferred since a large number of inductor cores may be fabricated simultaneously using a single mold and processing step. In the experimental inductor, the core 106 has a cross-section of 650 um by 500 um.

FIGS. 2A through 2G are pictorial diagrams of a first exemplary method for fabricating an inductor similar to the first inductor on a substrate 202 similar to the first substrate 104. Since typical RF transceivers employ inductances on the order of 5 nH, the first exemplary method particularly fabricates inductors with one, two, and four turns of a similar inductance. However, those skilled in the art will recognize that specific materials and thicknesses presented below may be varied to fabricate a wide variety of monolithic inductors. For instance, the substrate 202 may be either silicon or ceramic.

Figure 2A:
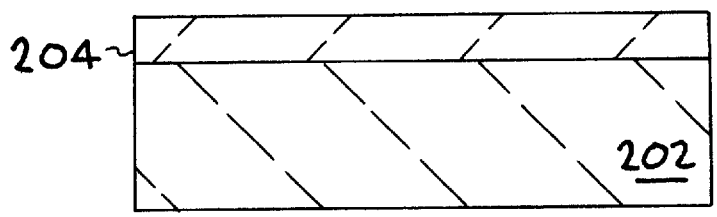
FIGS. 2A through 2G are pictorial diagrams of a first exemplary method for fabricating an inductor similar to the first inductor on a substrate similar to the first substrate.
Figure 2B:
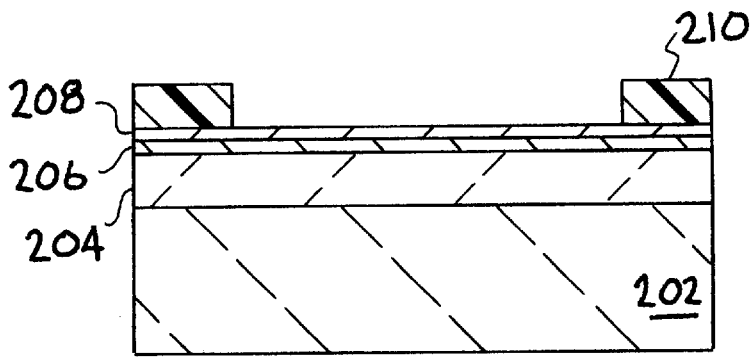
Figure 2C:
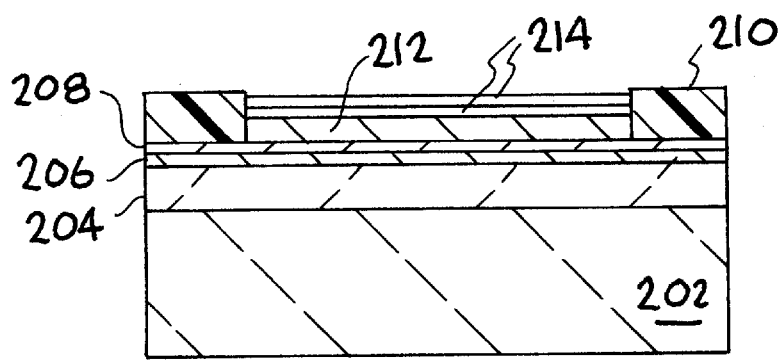
Figure 2D:
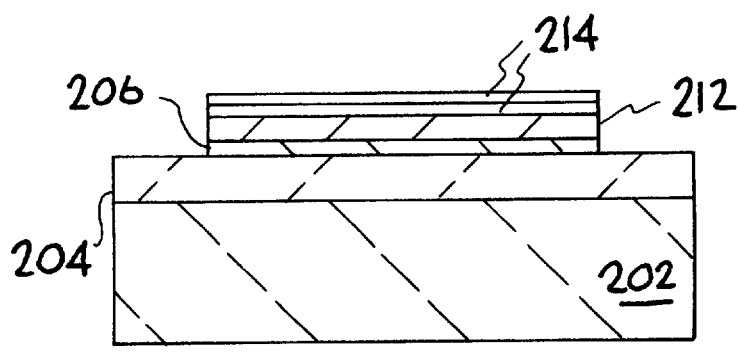

First, the substrate 202 passivated with 5 um or 10 um of a low-temperature oxide 204, see FIG. 2A. Second, a 500 Å titanium 206 and 3000 Å copper seed layer 208 are sputtered over the oxide 204, see FIG. 2B. Next, the two layers 206 and 208 are covered by an 8 um thick electroplated photo-resist 210. An electroplating method is chosen because such method can conformally deposit a thick resist on a complex surface, such as an inductor core which is discussed later. Next, the photo-resist 210 is exposed through a pattern representing a set of lower traces using photolithography techniques. Then, 5 um of copper is electroplated to the copper seed layer 208 to form the set of lower traces 212, see FIG. 2C. To prevent copper oxidation, the electroplated copper is passivated with two 1000 Å layers of electrolytic nickel and gold 214. Next, the photo-resist 210 and copper/titanium seed layers 204 and 208 are removed with a wet etch, leaving the lower metal traces 212 of the inductor on the substrate 202, see FIG. 2D.

A core 216 for the inductor can be an insulator, such as Alumina, or a ferromagnetic material, such as iron. In one embodiment, a discrete core is cut from a wafer and bonded to the lower copper traces 212 and 214 with an epoxy which is applied at each end of the core and which does not protrude into a high field region between and around the lower copper traces 212 and 214. In another embodiment, a core is formed using a preconstructed mold which shapes a core material or a precursor core material. The mold could be made of polyethylene and the core precursor could be a silica aerogel or xerogel.

Figure 2E:
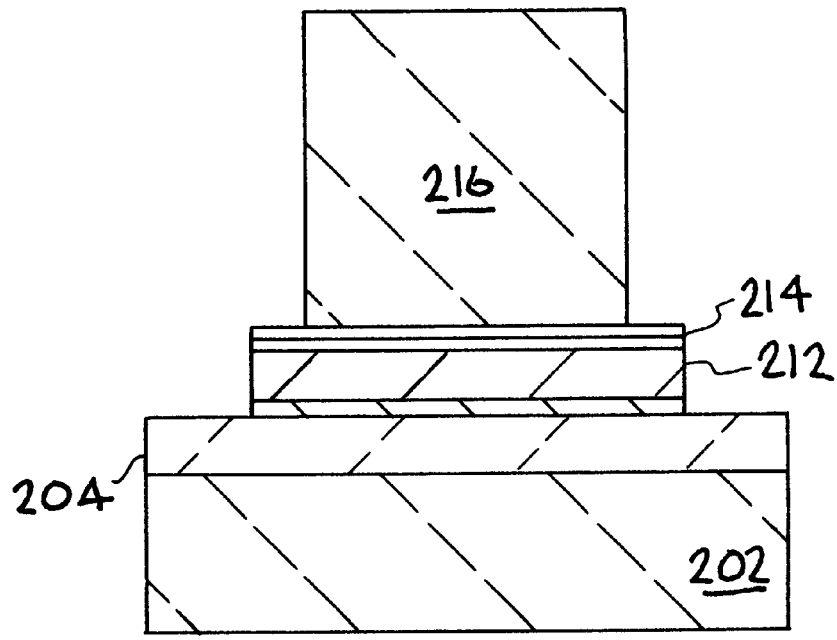

The core 216 is located on the traces 212 and 214 so that each end of each of the traces 212 and 214 protrude beyond the core and the core 216 substantially comes into physical contact with the traces, see FIG. 2E. If the core 216 is a conducting material, such as iron, an insulating layer is applied to the traces 212 and 214 before the core 216 is deposited. The insulating layer does not cover the ends of the traces. An insulating layer could instead or additionally be applied about the conducting core before locating the core on the lower traces.

Figure 2F:
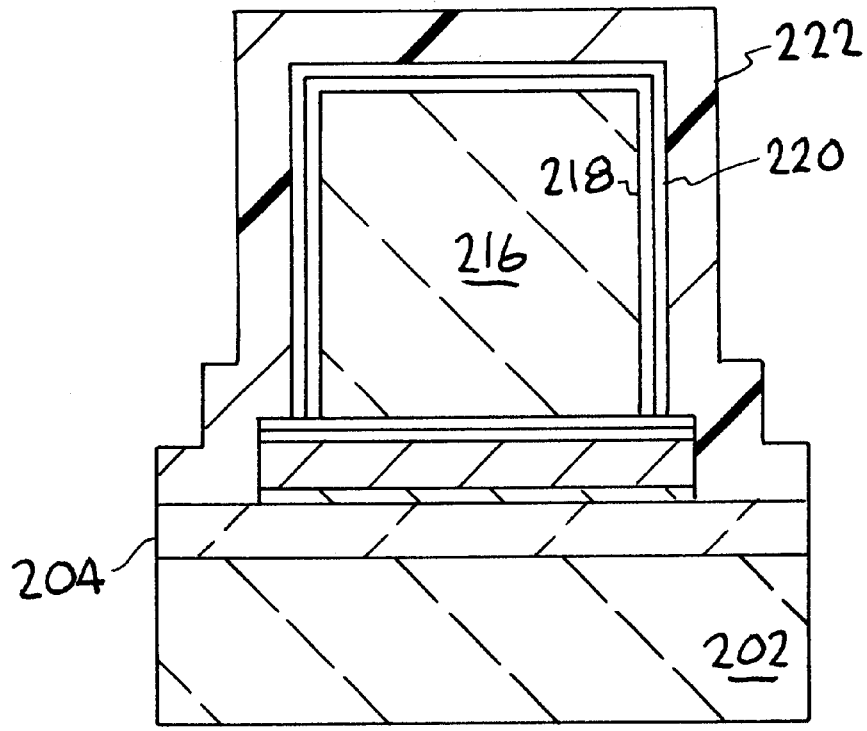
Figure 2G:
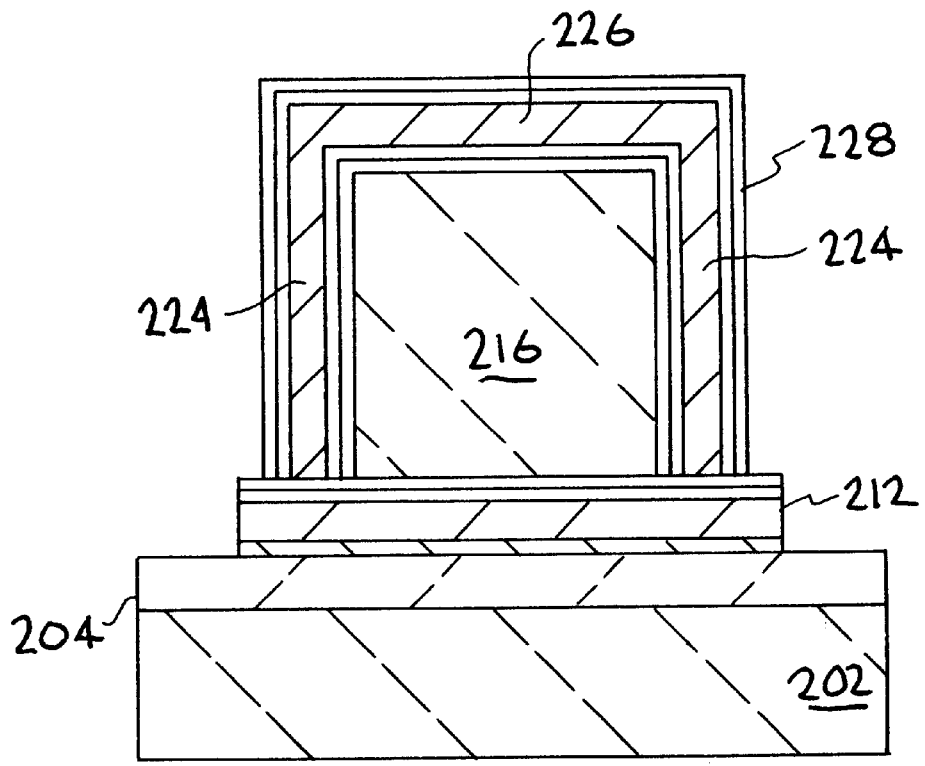

The core 216 is sputtered with a 500 Å titanium 218 and 3000 Å copper seed layer 220, which are then covered by an 8 um thick electroplated photo-resist 222, see FIG. 2F. Next, the photo-resist 222 is exposed using 3-D Laser Pantography techniques to form a pattern representing a set of side 224 and upper 226 traces. 3-D Laser Pantography is a technique which uses a mask-less direct-write laser to perform photo-lithography on a three-dimensional surface. U.S. patent application Ser. No. 08/387,495, entitled "3-D Laser Patterning Process," filed on Feb. 13, 1995 is incorporated herein by reference and provides a detailed discussion of how the side and upper traces may be formed on the substrate using 3-D Laser Pantography techniques.

After developing the laser exposed photo-resist 222, copper 5 um thick is electroplated to the core 216 to form the set of side 224 and upper 226 traces. To prevent copper oxidation, the electroplated copper is passivated with two 1000 Å layers of electrolytic nickel and gold 228. Next, the photo-resist 222 is removed with a wet etch, followed by removal of the seed layer 220, see FIG. 2G. The lower, side, and upper traces are in electrical communication with each other and thus the inductor is formed. FIG. 1B illustrates an embodiment with the core 106 having side dimensions of 650 μm. Since the lower traces 108 are shown having a thickness of 5 μm, the dimensions of the core are significantly larger than the thickness of the lower traces.

Some inductor embodiments may require a gas (i.e. non-solid) core. To effect such a design using the present invention, a core material susceptible to solvents may be chosen and an additional step during fabrication is dissolving the core of the inductor after lower, side and upper traces have been formed. For example, a molded silica aerogel or xerogel core could be rapidly etched away without substantial damage to other materials using a solution containing hydrogen fluoride and an appropriate substitute for the titanium layer.

The fabrication steps described above can be incorporated into computer programs which controls various manufacturing equipment to form the inductor. Such programs preferably operate on a conventionally known computer system (not shown). The computer system includes an internal memory for storing computer program instructions which control how a processing unit within the computer accepts, transforms, and outputs data which controls the manufacturing equipment. Those skilled in the art will recognize that the internal memory can be configured with computer memory media, such as a compact disk, flash memory cards, a magnetic disc drive or a dynamic random access memory.

Figure 3:
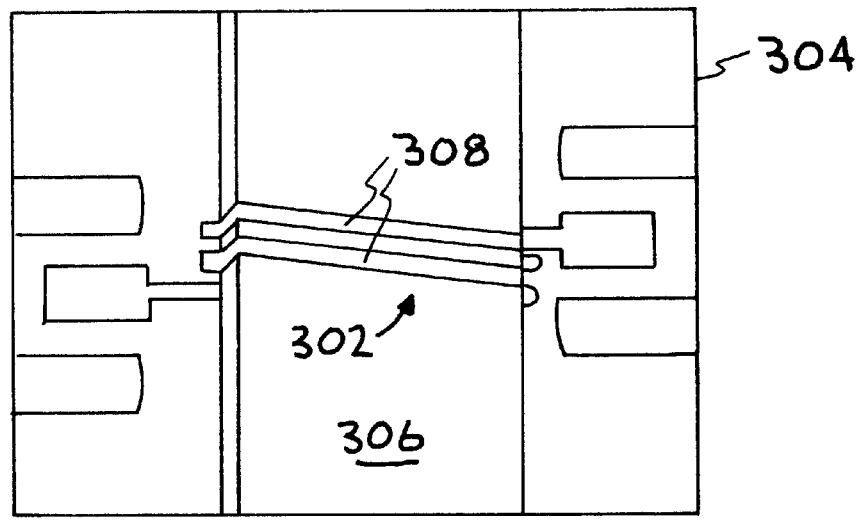
FIG. 3 is a pictorial diagram of a top view of a two-turn inductor fabricated using the exemplary method.

FIG. 3 is a pictorial diagram of a top view of a two-turn inductor 302 fabricated using the first exemplary method. The inductor 302 is viewed using a scanning electron microscope on a standard silicon wafer substrate 304 having a 5 um oxide layer. The inductor 302 has a core 306 and top trace lines 308, which are visible in this pictorial. The inductor 302 has an 8 nH inductance, and a peak Q-value of 16 near 900 MHz. This Q-value is substantially higher than that for common spiral inductors.

Figure 4:
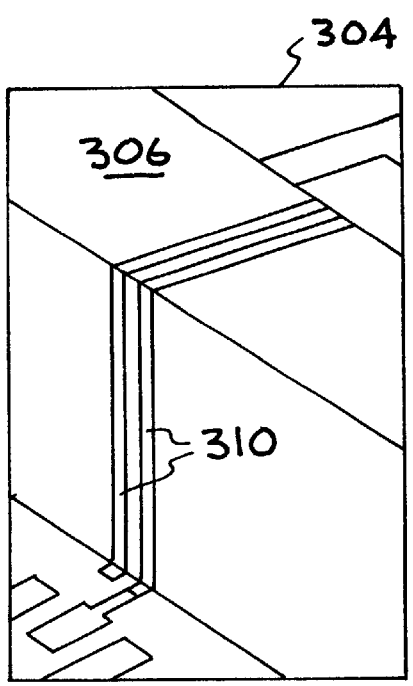
FIG. 4 is a pictorial diagram of a perspective view of the two-turn inductor fabricated using the exemplary method.

FIG. 4 is a pictorial diagram of a perspective view of the two-turn inductor 302 fabricated using the first exemplary method. The core 306 and side-wall trace lines 310 are visible in this pictorial.

Figure 5:
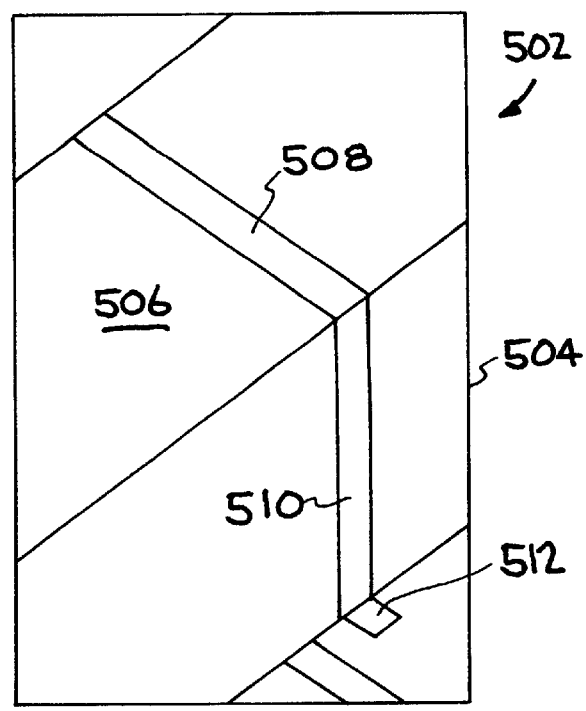
FIG. 5 is a pictorial diagram of a perspective view of a one-turn inductor fabricated using the exemplary method.

FIG. 5 is a pictorial diagram of a perspective view of a one-turn inductor 502 fabricated using the first exemplary method. The inductor 502 is viewed using a scanning electron microscope on a standard silicon wafer substrate 504. The inductor 502 has a core 506, upper trace lines 508, side trace lines 510, and lower trace lines 512 which are visible in this pictorial.

Figure 6:
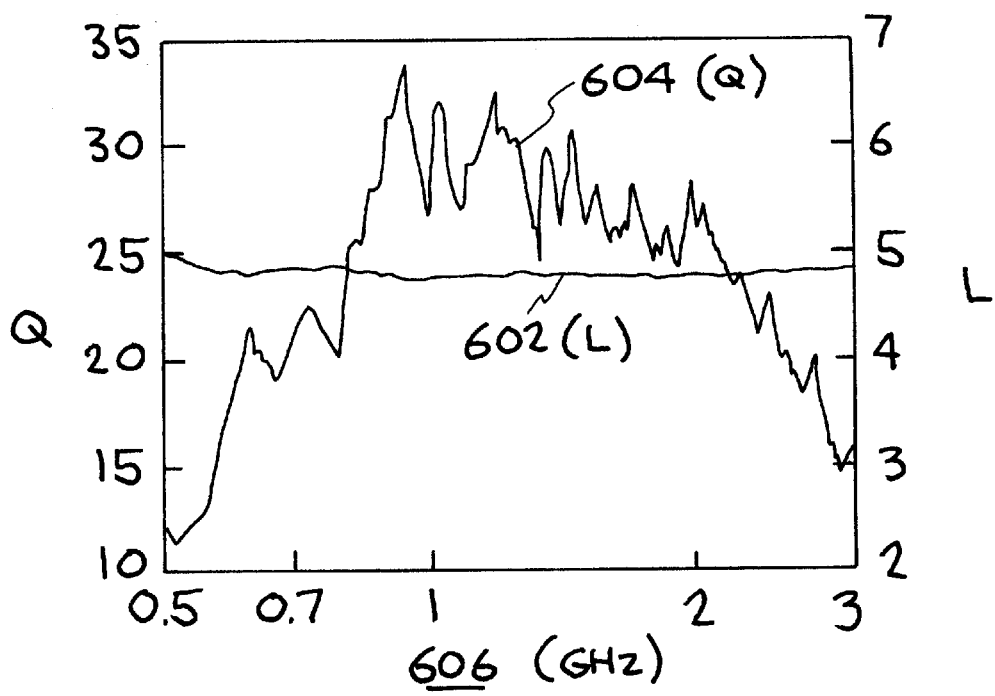
FIG. 6 is a graph of inductance (L) and quality (Q) verses frequency (GHz) for the one-turn inductor.

FIG. 6 is a graph of inductance (L) 602 and quality (Q) 604 verses frequency (GHz) 606 for the one-turn inductor 502. A Q-value of 30 at 1 GHz and a resonant frequency of over 10 GHz were measured for the single turn inductor 502. The 10 GHz resonant frequency is well above a typical 1 GHz operating frequency for most wireless communications devices.

Figure 7:
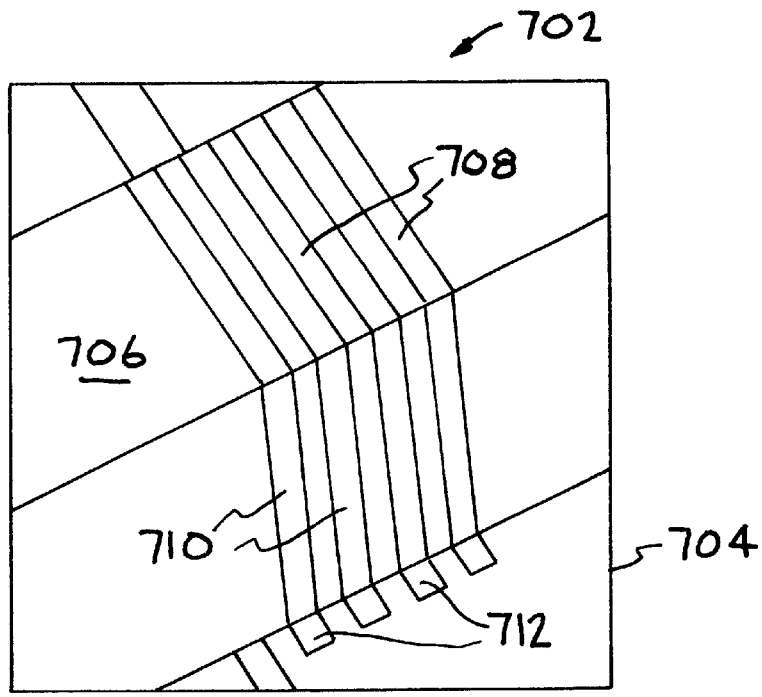
FIG. 7 is a pictorial diagram of a perspective view of a four-turn inductor fabricated using the exemplary method.

FIG. 7 is a pictorial diagram of a perspective view of a four-turn inductor 702 fabricated using the first exemplary method. The inductor 702 is viewed using a scanning electron microscope on a standard silicon wafer substrate 704. The inductor 702 has a core 706, upper trace lines 708, side trace lines 710, and lower trace lines 712 which are visible in this pictorial.

Figure 8:
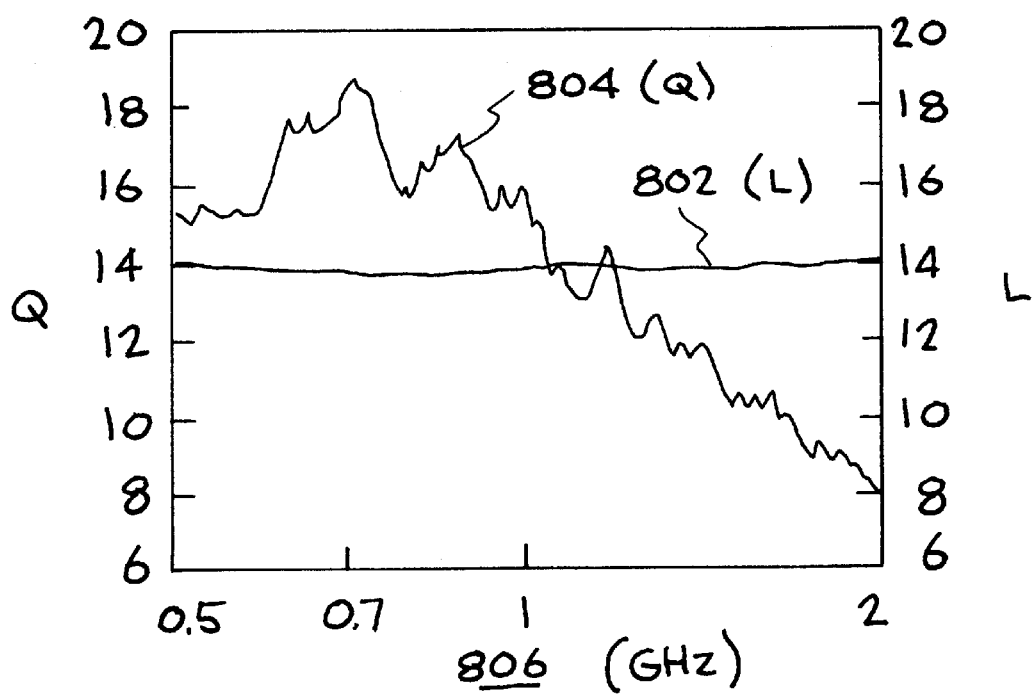
FIG. 8 is a graph of inductance (L) and quality (Q) verses frequency (GHz) for the four-turn inductor.

FIG. 8 is a graph of inductance (L) 802 and quality (Q) 804 verses frequency (GHz) 806 for the four-turn inductor 702. A Q-value of about 18 at about 700 MHz and a resonant frequency of over 4 GHz were measured for the four turn inductor 702.

FIGS. 9A through 9D are a pictorial diagram of a second exemplary method for fabricating a second three-dimensional coil inductor within a second substrate 902. The second substrate 902 is preferably a non-silicon substrate, such as a ceramic circuit board.

The second exemplary method of inductor fabrication is an alternative especially if a thick film (e.g. ceramic or FR4) circuit-board substrate is used. The second exemplary method of inductor fabrication is also recommended for use in proximity to silicon ICs which would normally be attached, both physically and electrically, to a circuit board.

Figure 9A:
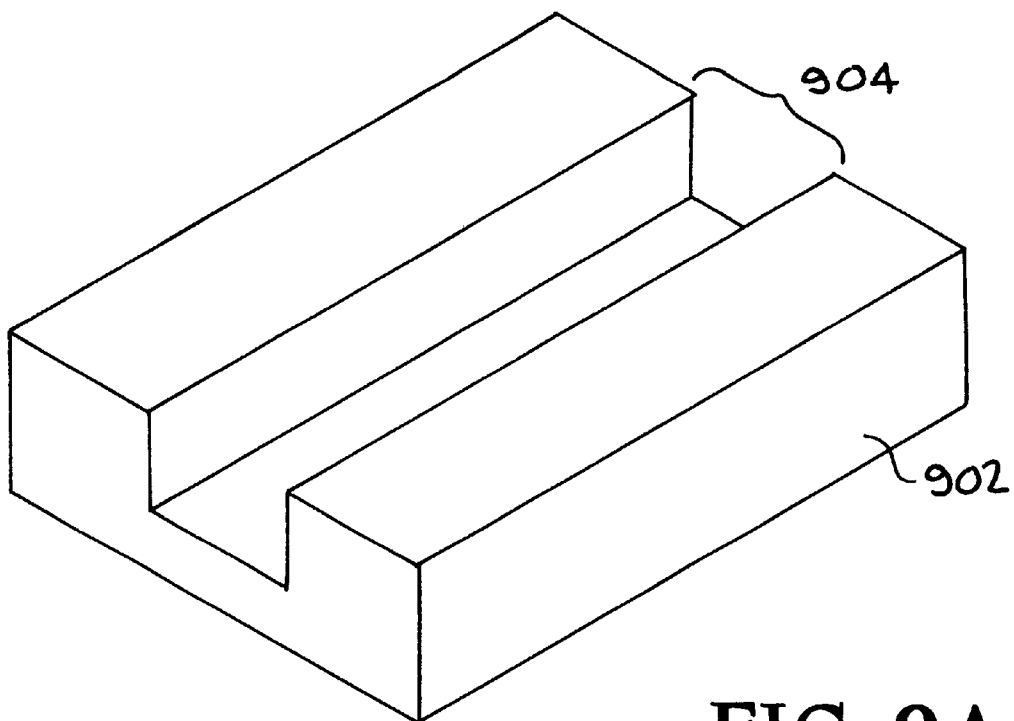
FIGS. 9A through 9D are a pictorial diagram of an exemplary method for fabricating a second three-dimensional coil inductor within a second substrate.
Figure 9B:
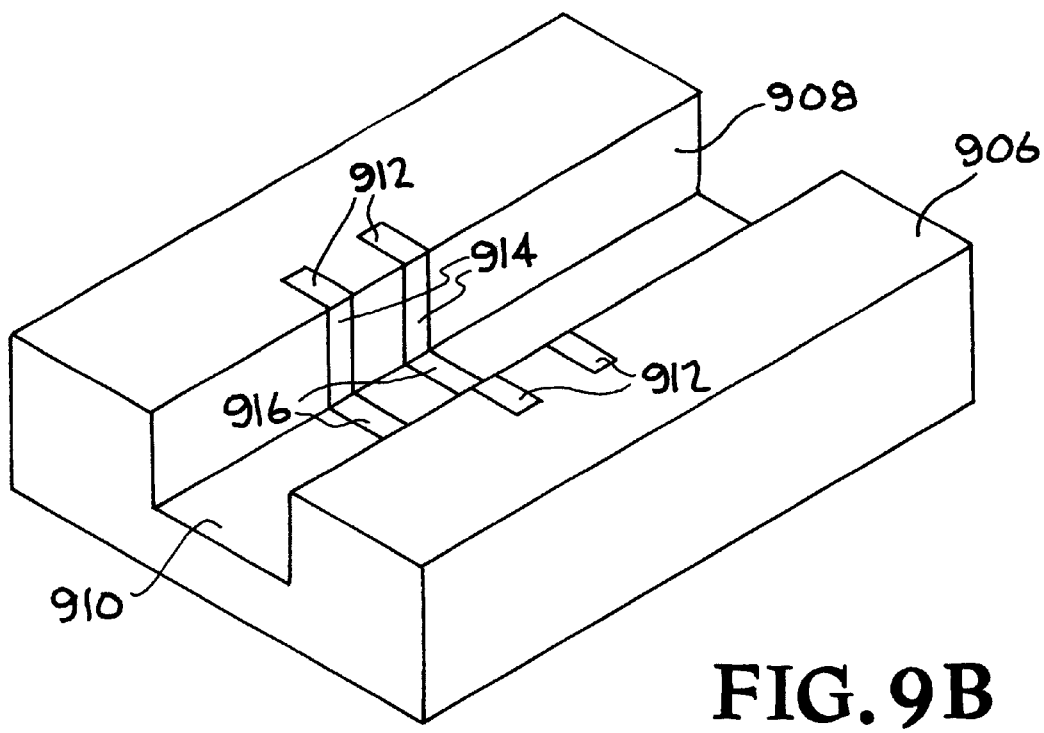
Figure 9C:
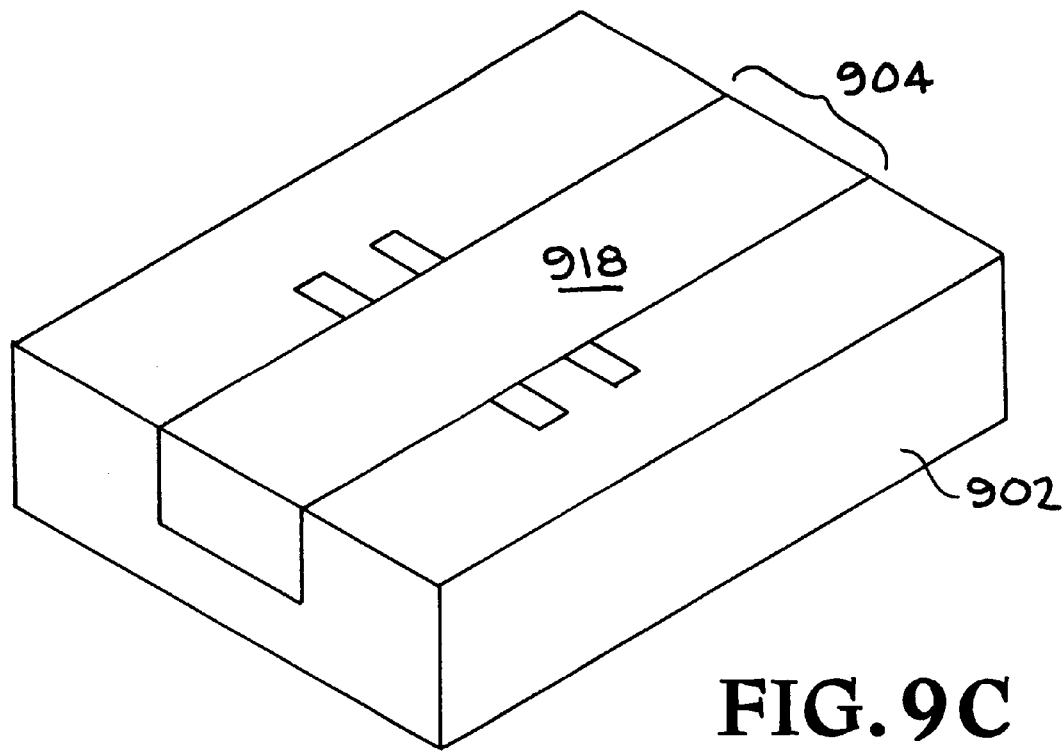

The second exemplary method begins by providing a substrate with a recess 904 having a dimension based on a desired inductance, see FIG. 9A. The recess 904 can be of any geometric profile, both in cross-section and axially. For instance, either cross-section of the recess 904 may be rectangular with vertical walls, trapezoidal with walls sloping outward as they ascend, or generally of a curved shape. Surfaces in the substrate 902 which form the recess 904 are preferably non-conductive. If the surfaces are conductive, an insulative substance is attached to those surfaces. Next, a set of top 912, side 914, and lower 916 traces are fabricated using the metalization and 3D Laser Pantography steps discussed earlier in reference to the first exemplary method, as shown in FIG. 9B. The top traces 912 are located on a top surface 906 of the substrate 902. The side traces 914 are located down sides 908 of the recess 904. The lower traces 916 are located across a bottom 910 of the recess 904. Two traces are shown in FIG. 9B in preparation for fabricating a one-turn inductor.

In a next step, a core 918 is formed in the recess 904. Again, the core 918 can be an insulator or a ferromagnetic material, such as iron. The core 918 can be a discrete part which inserted into the recess 904 or can be poured into the recess 904 either in a melted form or as a liquid precursor material which is subsequently cured, see FIG. 9C.

If the core 918 is discrete, a portion of a gap between a top portion of the core 918 and a top portion of the recess 904 and proximate to the side traces 914 is preferably bridged. Just a portion or an entire amount of the gap may be bridged. Such gap can be bridged with a liquid epoxy which subsequently hardens.

If the core 918 is a conducting material, such as iron, in one embodiment, an insulating layer is applied to the traces 914 and 916 in the recess 904 prior to placing the core 918 into the recess 904. In another embodiment, an insulating layer is applied to the core 918 before insertion. In yet another embodiment, spacers for keeping the core 918 slightly away from the traces 914 and 916 are inserted in the recess 904 to prevent the core 918 from shorting the traces to each other.

Figure 9D:
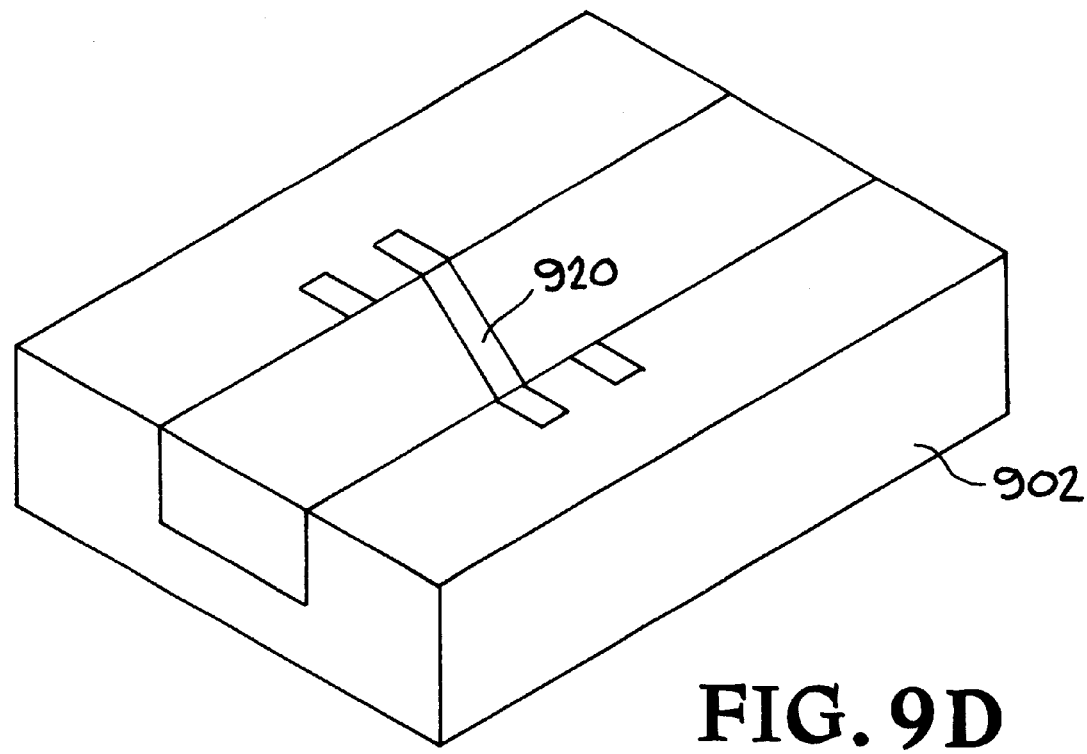

Lastly, an upper trace 920 is laid over the core 918 and connects to two of the top traces 912 which completes fabrication of the one-turn inductor, see FIG. 9D. Those skilled in the art will recognize that an inductor of any number of turns may be fabricated using these techniques. As an optional additional step, the core 918 may be chosen to be susceptible to a solvent and the solvent can then be used to dissolve the core 918, leaving the one-turn inductor intact.

In an alternate embodiment, the techniques discussed herein may be used to form coils for solenoids, relays, transformers, antennas, and other electrical devices having coil structures. In another alternate embodiment, the techniques discussed herein may be used to form monolithic mechanical structures such as springs or heat spreaders. In addition, other monolithic structures may be formed using the techniques described here which form a non-coil lattice or array structures.

While the present invention has been described with reference to a preferred embodiment, those skilled in the art will recognize that various modifications may be made. Variations upon and modifications to the preferred embodiment are provided by the present invention, which is limited only by the following claims.

What is claimed is:

1. A method for fabricating a three-dimensional coil, comprising the steps of:
   forming a set of lower traces on a substrate;
   locating a core having dimensions significantly larger than the thickness of the lower traces over the lower traces;
   forming a set of side traces on the core using a three dimensional lithography technique;
   coupling the side traces to the lower traces;
   forming a set of upper traces on the core; and
   coupling the upper traces to the side traces so as to form a coil structure.

2. The method of claim 1, further comprising the step of:
   dissolving the core.

3. The method of claim 1, wherein the forming steps comprise the step of:
   forming electrically conductive traces.

4. The method of claim 3, wherein the forming steps further comprise the step of:
   forming copper traces.

5. The method of claim 1, wherein the forming a set of lower traces step comprises the step of:
   forming a set of lower traces on a silicon substrate.

6. The method of claim 1, wherein the forming a set of lower traces step comprises the step of:
   forming a set of lower traces on a ceramic substrate.

7. The method of claim 1, wherein the step of locating a core comprises the steps of:
   placing a mold over the lower traces; and
   distributing a core material into the mold.

8. The method of claim 1, wherein the step of locating a core comprises the step of:
   locating an insulating core over the lower traces.

9. The method of claim 1, wherein the step of locating a core comprises the step of:
   locating a ferro-magnetic core over the lower traces.

10. The method of claim 1, further comprising the step of:
    inserting an insulator over the lower traces before locating a core over the lower traces.

11. The method of claim 1, wherein the step of locating a core comprises the step of:
    locating a ferromagnetic core with an outer insulating layer.

12. A system for fabricating a three-dimensional coil, comprising:
    means for forming a set of lower traces on a substrate;
    means for locating a core having dimensions significantly larger than the thickness of the lower traces over the lower traces;
    means for forming a set of side traces on the core using a three dimensional lithography technique;
    means for coupling the side traces to the lower traces;
    means for forming a set of upper traces on the core; and
    means for coupling the upper traces to the side traces so as to form a coil structure.

13. The system of claim 12, further comprising:
    means for dissolving the core.

14. The system of claim 12, wherein the means for forming comprise:
    means for forming electrically conductive traces.

15. The system of claim 12, further comprising:
    means for inserting an insulator over the lower traces before the means for locating a core over the lower traces.

16. The system of claim 12, wherein the means for locating a core comprises:
    means for placing a mold over the lower traces; and
    means for distributing a core material into the mold.

17. A computer-usable medium embodying computer program code for causing a computer to fabricate a three-dimensional coil, by performing the steps of:
    forming a set of lower traces on a substrate;
    locating a core having dimensions significantly larger than the thickness of the lower traces over the lower traces;
    forming a set of side traces on the core using a three-dimensional lithography technique;
    coupling the side traces to the lower traces;
    forming a set of upper traces on the core; and
    coupling the upper traces to the side traces so as to form a coil structure.

18. The computer-usable medium of claim 17, further performing the step of:
    dissolving the core.

19. The computer-usable medium of claim 17, wherein the forming steps performs the step of:
    forming electrically conductive traces.

20. The computer-usable medium of claim 17, further performing the step of:
    inserting an insulator over the lower traces before locating a core over the lower traces.

21. The computer-usable medium of claim 17, wherein the step of locating a core performs the steps of:
    placing a mold over the lower traces; and
    distributing a core material into the mold.

22. A method for fabricating a three-dimensional coil, comprising the steps of:
    forming a set of lower traces on a substrate;
    locating a core having sides substantially orthogonal to the lower traces over the lower traces;
    forming a set of side traces on the core by creating a pattern on the substantially orthogonal surfaces;
    coupling the side traces to the lower traces;
    forming a set of upper traces on the core; and
    coupling the upper traces to the side traces so as to form a coil structure.

* * * * *